United States Patent
Lou

(10) Patent No.: US 6,204,141 B1
(45) Date of Patent: Mar. 20, 2001

(54) METHOD OF MANUFACTURING A DEEP TRENCH CAPACITOR

(75) Inventor: Chine-Gie Lou, Hsinchu Hsien (TW)

(73) Assignee: Taiwan Semiconductor Mfg. Co. Ltd., Hsinchu (TW)

( * ) Notice: Subject to any disclaimer, the term of this patent is extended or adjusted under 35 U.S.C. 154(b) by 0 days.

(21) Appl. No.: 09/661,098

(22) Filed: Sep. 13, 2000

(51) Int. Cl.[7] .................. H01L 21/332; H01L 21/8242
(52) U.S. Cl. .................... 438/386; 438/396; 438/398; 438/665
(58) Field of Search .................... 438/268, 248, 438/665, 964, 386, 391, 398, 396

(56) References Cited

U.S. PATENT DOCUMENTS

| | | | | |
|---|---|---|---|---|
| 5,691,228 | * | 11/1997 | Ping et al. | 437/60 |
| 5,877,061 | * | 3/1999 | Halle et al. | 438/386 |
| 6,033,967 | * | 3/2000 | Li et al. | 438/396 |
| 6,087,240 | * | 7/2000 | Gilchrist | 438/398 |
| 6,103,570 | * | 8/2000 | Sandhu et al. | 438/225 |
| 6,103,571 | * | 8/2000 | Li et al. | 438/225 |
| 6,146,968 | * | 11/2000 | Lu et al. | 438/398 |

* cited by examiner

Primary Examiner—Vu A. Le
Assistant Examiner—Michael S. Lebentritt
(74) Attorney, Agent, or Firm—Jiawei Huang; J C Patents

(57) ABSTRACT

A method of manufacturing a deep trench capacitor. A first silicon oxide layer is formed on a substrate. A first trench is formed in the substrate. A rugged polysilicon layer is formed on the surface of the first trench. The grains of the rugged polysilicon layer are distributed discretely on surface of the first trench. A second silicon oxide layer is formed on the rugged polysilicon layer. The exposed substrate in the first trench is etched, in order to form a plurality of second trenches in the substrate of the first trench. The first and second silicon oxide layer are removed. A first conductive layer is formed over the substrate and conformal to the first trench and the second trenches. A dielectric layer is formed on the first conductive layer. A second conductive layer is formed on the dielectric layer.

17 Claims, 3 Drawing Sheets

METHOD OF MANUFACTURING A DEEP TRENCH CAPACITOR

BACKGROUND OF THE INVENTION

1. Field of the Invention

The present invention relates to a method of manufacturing a semiconductor device. More particularly, the present invention relates to a method of manufacturing a deep trench capacitor.

2. Description of the Related Art

In a Dynamic random Access Memory (DRAM), the capacitor is the signal storage center. The more electric charges are stored in the capacitor, the less likely it is to be influenced by noise (for example, the soft errors created by particle α) when retrieving data, and the refresh frequency of the DRAM can also be reduced.

However, when the semiconductor process enters a deep sub-micron manufacturing, the dimensions of the devices are shrunk correspondingly. In light of the former DRAM storage memory structure, it also reflects that the space for accommodating a capacitor is becoming smaller. Therefore, how to maintain the capacitor so that there is ample capacitance becomes an important topic for manufacturing a semiconductor device that is about 0.25 $\mu$m and smaller. In order to increase the area of the capacitor, a popular method is provided to increase the capacitance of the capacitor.

The stacked capacitor and the trench-type capacitor are conventionally used to increase the surface area of the capacitor. The stacked capacitor has many different three-dimensional structures such as a crown, fin, cylinder, or a spread, while the trench-type capacitor has different three-dimensional structures such as a deep trench or a buried strap trench. Even if the various structures of the above described capacitors fulfill the requirements of designs for relatively high DRAM density, however, under the limited design rules of the device dimensions, it is very difficult to solely use these structures to manufacture a capacitor of 256 MB or as much as 1 GB DRAM.

SUMMARY OF THE INVENTION

The invention provides a method of manufacturing a deep trench capacitor with a large capacitance, which has a unique combination of a deep trench with a fin structure, so that it is applicable towards the manufacturing of a 256 MB (or greater) DRAM.

A second object of the present invention is to provide a method of manufacturing a deep trench capacitor. By using a rugged polysilicon layer, the inner trench surface forms fin openings and forms a conformal lower electrode on the trench surface, thereby increasing the surface area of the lower electrode of the capacitor.

Yet another object of the present invention is to provide a method of manufacturing a deep trench capacitor. A thermal oxidation rate of a rugged polysilicon layer of a trench surface within a silicon substrate is greater than the thermal oxidation rate of silicon substrate. Thus, a relatively thick oxide layer is formed on the surface of the rugged polysilicon layer, and the oxide layer formed on the silicon substrate in the trench is removed. Etching is performed on the exposed trench surface, thereby forming fin openings on the inner trench surface. A conformal lower electrode is formed on the trench surface, hence, increasing the surface area of the lower electrode of the capacitor.

As embodied and broadly described herein, the invention provides a method of manufacturing a deep trench capacitor. This method includes forming a first silicon oxide layer, and subsequently forming a first trench in the substrate. A discrete rugged polysilicon layer is formed on the first trench surface. A second silicon oxide layer is formed on the surface of the rugged polysilicon layer. The exposed substrate surface is etched to form second trenches in the substrate. Thereafter, the first silicon oxide layer and second silicon oxide layer are removed. A first conductive layer is formed conformal to the surfaces of the first trench and second trenches. A dielectric layer and a second conductive layer are sequentially formed on the first conductive layer, thereby completing the capacitor manufacturing process.

In accordance with the method proposed in the above-described invention, the thermal oxidation rate of the rugged polysilicon layer that is greater than the thermal oxidation rate of the silicon substrate. Therefore, a thick silicon oxide layer is formed on the rugged polysilcon surface. The silicon oxide layer formed on the silicon substrate in the trench is removed. The exposed trench surface is subsequently etched, thereby causing the trench surface to be uneven. A lower electrode is formed conformal to the trench surface. Hence, the surface area of the lower electrode is increased. This is the first time that using discrete rugged polysilicon layer and different thermal oxidation rates to manufacture a capacitor structure with the combined deep trench and fin three-dimentional characteristics.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

FIGS. 1A to 1E, are diagrams in cross-sectional view illustrating a method of manufacturing a deep trench capacitor, according to a preferred embodiment of the present invention.

Figure 1A:
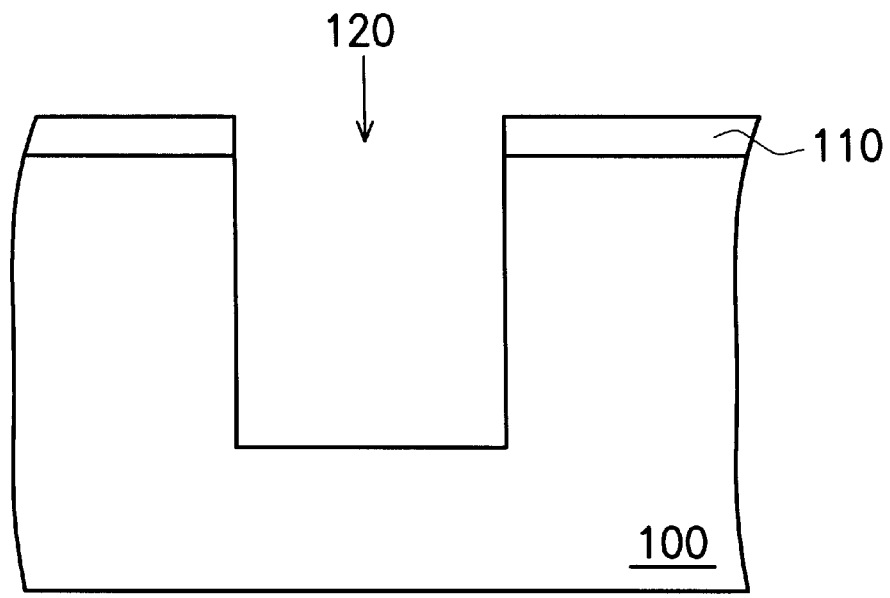
FIGS. 1A to 1E are diagrams in cross-sectional view illustrating a method of manufacturing a deep trench capacitor, according to a preferred embodiment of the present invention.

Referring to FIG. 1A, a silicon oxide layer 110 is first formed on a substrate 100. A trench 120 is subsequently formed in the substrate 100. The silicon oxide layer 110 is formed by thermal oxidation, for example. The trench 120 is formed by a process such as lithographic and etching.

Figure 1B:
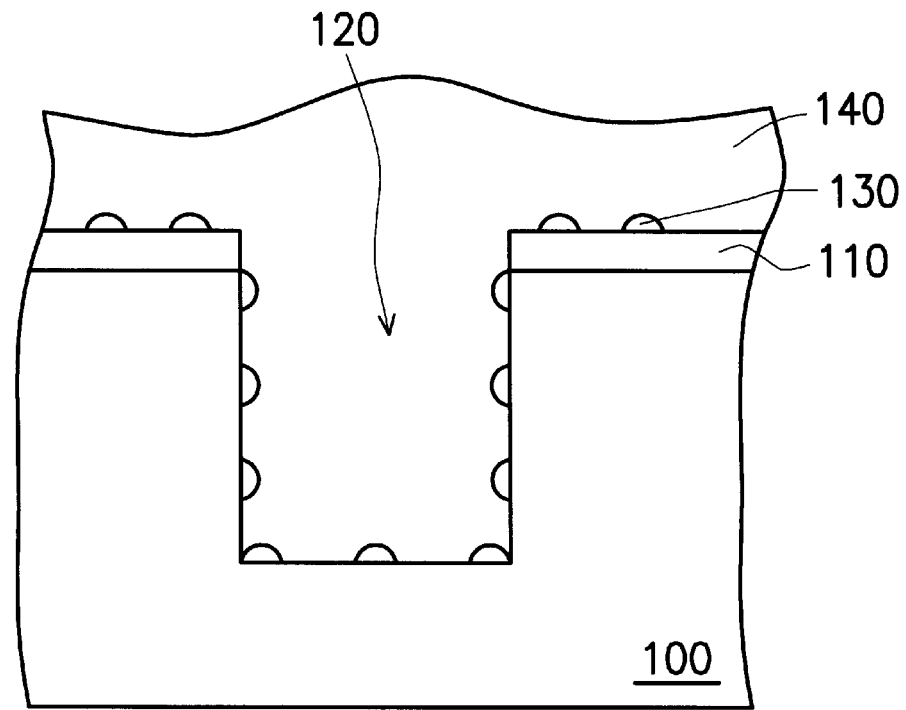

Referring to FIG. 1B, a rugged polysilicon layer 130 is formed on the trench 120 and the silicon oxide layer 110. A sacrificial layer 140, made from a material such as a photoresist material, is formed in substrate 100.

The grains of the above-described rugged polysilicon layer 130 are distributed discretely on the surface of the trench 120 and the silicon oxide layer 110. The grains are preferably at a size of about 800 Å to 2000 Å, and the distance between grains is preferably from about 2000 Å to 4000 Å. The rugged polysilicon layer 130 is formed by a process such as chemical vapor deposition (CVD) with a reactive gas such as silane (SiH$_4$) and phosphine (PH$_3$) at a temperature from about 530° C. to 580° C.

Figure 1C:
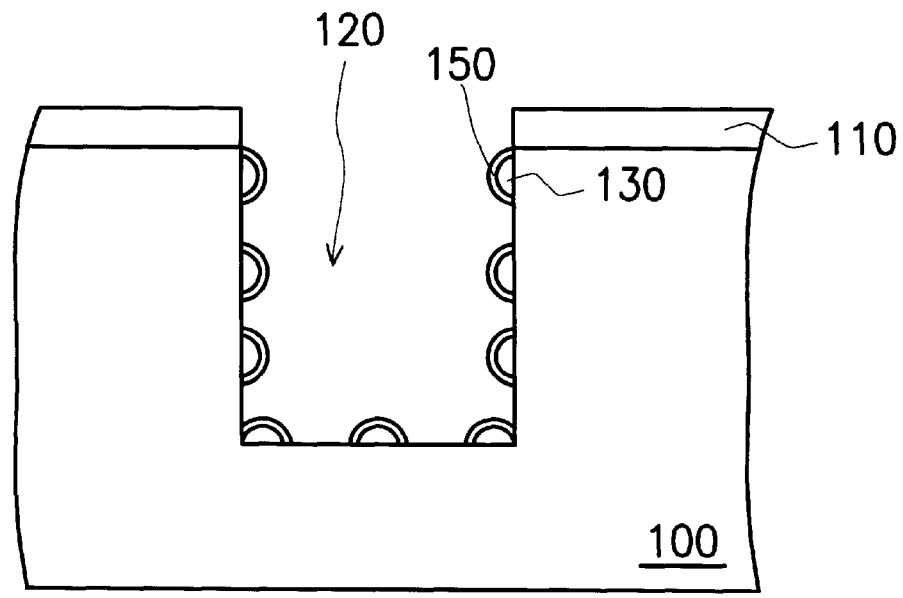

Referring to FIG. 1C, the sacrificial layer 140 and the rugged polysilicon layer 130 higher than the silicon oxide layer 110 are removed by a process such as chemical mechanical polishing. Thereafter, the sacrificial layer 140 inside the trench 120 is removed. If the sacrificial layer 140 were made of a photoresist material, then oxygen plasma is used in ashing the sacrificial layer 140, and then a cleaning solution is used to remove the photoresist residue.

Thermal oxidation is then performed, thus forming a silicon oxide layer on the rugged polysilicon layer 130 and the exposed surface of the trench 120. By using the dilute phosphoric acid (HF) solution to etch the silicon oxide layer, the silicon oxide layer on the trench 120 surface is removed, leaving behind the silicon oxide layer 150 on the surface of the rugged polysilicon layer 130. The concentration of this dilute phosphoric acid water solution is preferably at about 300 to 500 times diluted.

Here, one point that must be paid special attention. Even though the materials of the substrate 100 and the rugged polysilicon layer 130 are both made of silicon atoms, however, due to the difference in orientation of the grain and the difference of the doping concentration, the thermal oxidation rates are quite different. Generally, the thermal oxidation rate is doped polysilicon>undoped polysilicon>monosilicon. Consequently, the oxidation rate of the rugged polysilicon layer 130 is approximately 2 to 3 times greater than the oxidation rate of the substrate 100. Hence, the thickness of the silicon oxide layer on the rugged polysilicon layer 130 is approximately 2 to 3 times as thick as the silicon oxide layer on the exposed surface of the trench 120 (not illustrated). Consequently, when using the dilute HF solution to etch the silicon oxide layer, the silicon oxide layer on the exposed surface of the trench 120 is first etched away, and only the silicon oxide layer 150 on the surface of the rugged polysilicon layer 130 remains.

Figure 1D:
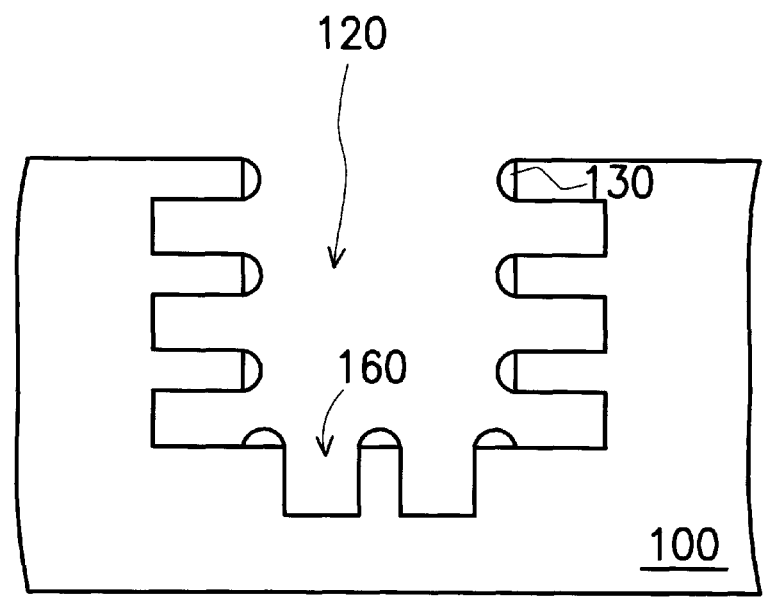

Referring to FIG. 1D, trenches 160 are formed in the exposed surface of the trench 120 by an etching process. The etching process used here is preferably an isotropic etching process such as chemical dry etching (CDE). If chemical dry etching is used, in considering silicon materials, the etching gases preferably containing halogen gas and oxygen gas. The gas ratio between halogen gas and oxygen gas is 1:1. It contains a halogen gas such as carbon tetrafluoride (CF$_4$), and an oxygen gas (O$_2$), for example. The flow rate is 20–500 sccm and 20–500 sccm respectively. During CDE process, an inactive gas, such as nitrogen gas (N$_2$), can be added to dilute the reactive gas, for example, with a flow rate of 1–100 sccm.

The silicon oxide layers 110 and 150 are removed by an etching solution such as dilute a HF solution having a concentration, which is 50–100 times diluted.

Figure 1E:
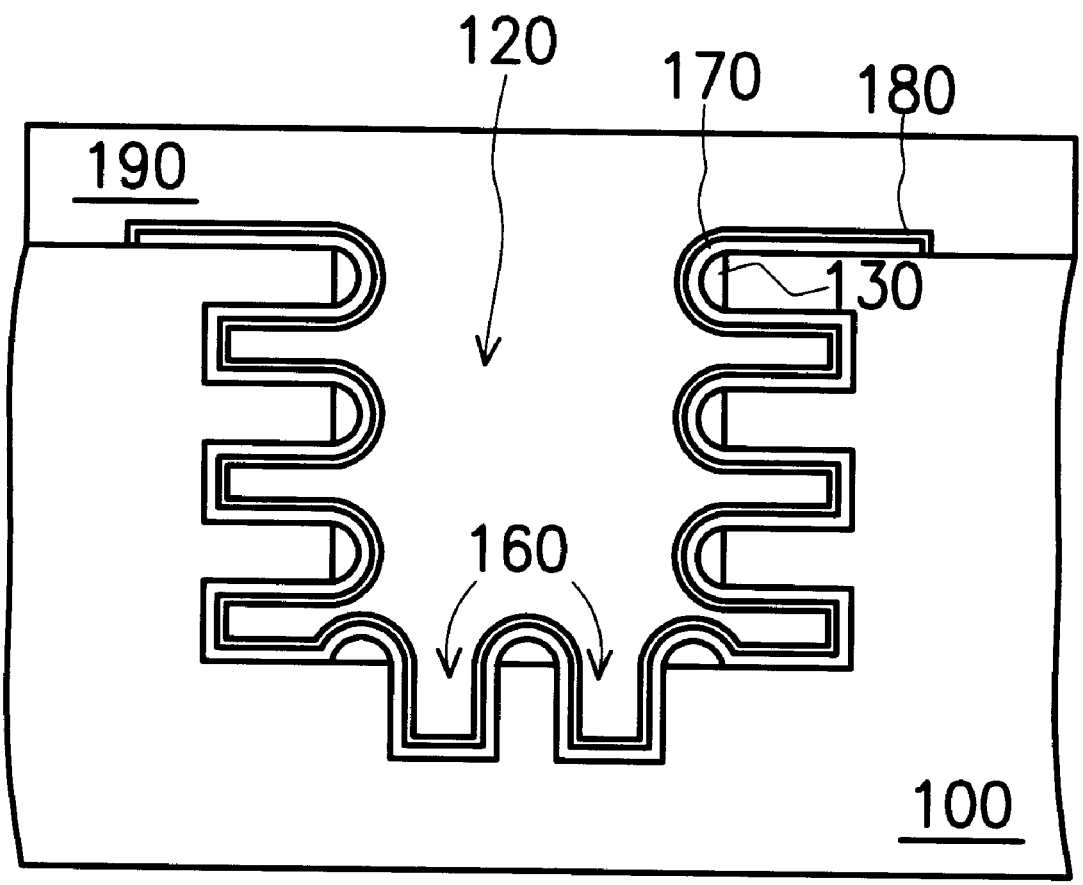

Referring to FIG. 1E, a conformal conductive layer (not shown) is formed to cover the trenches 120, 160 and the substrate 100. The conformal conductive layer is patterned to form a lower electrode 170 of a capacitor. The lower electrode 170 is made of a material such as doped polysilicon, and is made from a process such as low pressure chemical vapor deposition (LPCVD). The lower electrode 170 preferably has a thickness from about 300 Å to 500 Å.

A dielectric layer 180 is formed on the surface of the lower electrode 170 and the substrate 100. The material of the dielectric layer 180 is a multi-layered construction of silicon nitride/silicon oxide, or other suitable dielectric materials.

Furthermore, a conductive layer 190 is formed on the dielectric layer 180. The conductive layer 190 usually fills the trenches 120 and 160. The conductive layer 190 is used as an upper electrode of the capacitor. The conductive layer 190 can be made of a material such as doped poly silicon, and is made from a process such as LPCVD.

As can be seen from the above-mentioned preferred embodiments of the present invention, because the thermal oxidation rate of the rugged polysilicon layer is higher than that of the substrate, this invention causes the surface of the rugged polysilicon layer to form a relatively thick silicon oxide layer. The silicon oxide layer on the exposed substrate in the trench is removed. Next, etching is performed on the exposed trench surface, causing the trench surface to form small, fin-like trenches. A lower electrode is formed conformal to the trench surface, and a dielectric layer and an upper electrode is formed, thereby increasing the surface area of lower electrode of the capacitor.

The present invention uses the discrete rugged polysilicon layer and different thermal oxidation rates for forming a capacitor structure with the combined deep trench and fin-like trench characteristics. By applying the present method, neither an extra mask nor a complex manufacturing procedure is required, and such a large capacitance can be formed. This is a great contribution to increasing DRAM memory capacity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a deep trench capacitor, comprising:

forming a first silicon oxide layer on a substrate;

forming a first trench in the substrate;

forming a rugged polysilicon layer on a surface of the first trench, wherein the grains of the rugged polysilcon layer distributed discretely on surface of the first trench;

forming a second silicon oxide layer on the rugged polysilicon layer;

etching the exposed substrate in the first trench, in order to form a plurality of second trenches in the substrate of the first trench;

removing the first and second silicon oxide layer;

forming a first conductive layer over the substrate, wherein the first conductive layer is conformal to the first trench and the second trenches;

forming a dielectric layer on the first conductive layer; and forming a second conductive layer on the dielectric layer.

2. The method of claim 1, wherein the grain size of the rugged polysilicon layer is from about 800 Å to 2000 Å.

3. The method of claim 1, wherein a distance between grains of the rugged polysilicon layer is from about 2000 Å to 4000 Å.

4. The method of claim 1, wherein the step of forming the rugged polysilicon layer comprises chemical vapor deposition (CVD).

5. The method of claim 4, wherein a deposition temperature of the CVD is from about 530° C. to 580° C.

6. The method of claim 4, wherein a reactive gas used in CVD comprises SiH$_4$.

7. The method of claim 4, wherein a reactive gas source used in CVD comprises $PH_3$.

8. The method of claim 1, wherein the step of forming the rugged polysilicon layer comprises:

forming a rugged polysilicon layer on the first trench and the first silicon oxide layer;

forming a sacrificial layer on the rugged polysilicon layer, and filling the first trench;

removing the sacrificial layer and the rugged polysilicon layer that are higher than the first silicon oxide layer; and removing the sacrificial layer in the first trench.

9. The method of claim 8, wherein the sacrificial layer comprises a photoresist layer.

10. The method of claim 8, wherein the step of removing the sacrificial layer and the rugged polysilicon layer that are higher than the first silicon oxide layer comprises a chemical mechanical polishing.

11. The method of in claim 1, wherein the step of forming the second silicon oxide layer on the surface of the rugged polysilicon layer comprises:

performing a thermal oxidation process, thereby causing the rugged polysilicon layer and the exposed substrate in the first trench to respective form a second silicon oxide layer and a third silicon oxide layer thereon; and using a dilute HF solution to etching the third silicon oxide layer and a portion of the second silicon oxide layer.

12. The method of claim 11, wherein a concentration of the dilute HF solution is from about 300 to 500 times diluted.

13. The method of claim 1, wherein the step of etching the exposed substrate in the first trench comprises isotropic etching.

14. The method of claim 13, wherein the isotropic etching comprises a chemical dry etching (CDE).

15. The method of claim 1, wherein the step of removing the first and second silicon oxide layer comprises a use of a dilute HF solution with a concentration of 50 to 100 times diluted.

16. The method of claim 1, wherein the first conductive layer comprises a doped polysilicon layer formed by CVD.

17. The method of claim 16, wherein a thickness of the first conductive layer is from about 300 Å to 500 Å.

* * * * *